United States Patent [19]

Murakami

[11] Patent Number: 5,092,032

[45] Date of Patent: Mar. 3, 1992

[54] MANUFACTURING METHOD FOR A MULTILAYER PRINTED CIRCUIT BOARD

[75] Inventor: Takahiro Murakami, Kusatsu, Japan

[73] Assignee: International Business Machines Corp., Armonk, N.Y.

[21] Appl. No.: 700,736

[22] Filed: May 15, 1991

[30] Foreign Application Priority Data

May 28, 1990 [JP] Japan .................................. 2-135505

[51] Int. Cl.⁵ .............................................. H05K 3/36
[52] U.S. Cl. ........................................ 29/830; 29/832; 29/847
[58] Field of Search ................. 29/830, 832, 840, 847; 430/313, 315, 318

[56] References Cited

U.S. PATENT DOCUMENTS 3,769,108 10/1973 Feldman et al. .................. 29/424 X
4,763,403 8/1988 Klein et al. ....................... 29/830 X

FOREIGN PATENT DOCUMENTS 0089594 4/1989 Japan ...................................... 29/830
0098993 4/1990 Japan ...................................... 29/840

Primary Examiner—Timothy V. Eley
Attorney, Agent, or Firm—Richard M. Goldman

[57] ABSTRACT

Disclosed is a method for manufacturing a multilayer circuit board in which landless inter-layer connection is made between a lower-layer electric circuit and an upper-layer electric circuit formed on a substrate. The method of the invention utilizes a single photoresist to form a circuitization layer and the conductive via extending upwardly from it. In the method of the invention a metal layer is applied to the substrate, and photoresist is applied to the metal layer. The photoresist is then exposed and developed to define a resist hole. A via bump is formed in the resist hole. The residual resist is then imaged to form a first circuit pattern in the underlying metal layer. The remaining photoresist is removed from the first metal layer, and an organic dielectric layer is formed on the etched metal layer, the exposed substrate, and via bump. The organic dielectric layer is then flattened or otherwise processed to expose the surface of the via bump. Either a second metal layer or an electronic part is deposited or applied to the exposed top surface of the via bump as an upper-layer electric circuit element.

6 Claims, 3 Drawing Sheets

MANUFACTURING METHOD FOR A MULTILAYER PRINTED CIRCUIT BOARD

FIELD OF THE INVENTION

This invention relates to a method of forming inter-layer connection in a multilayer circuit board, and more particularly to a method for fabricating a multilayer printed-circuit board, where the vias are fabricated without drilling through interlayers of dielectric.

BACKGROUND OF THE INVENTION

In a multilayer printed circuit board, the interlayer connections are typically formed by drilling down through a dielectric layer of film to the next underlying circuit layer and coating the resulting via with a conductive plating. The prior art interlayer forming techniques used in making inter-layer connections between thin-film wiring layers on organic substrates (composed of materials such as epoxy resins) were based on drilling and/or etching the dielectric and plating the resulting via.

The prior art etching process is shown in FIG. 3 (a) to (g). In this method, a conductor layer 11 is formed on a substrate 10 having a dielectric layer (FIG. 3 (a)). Then, photoresist 12 is applied onto the conductor 11, selectively exposed and developed (FIG. 3 (b)). The conductor 11 is selectively etched to form the lower layer wiring circuit 13 on a desired portion (FIG. 3 (c)), and the remaining photoresist 12 is removed (FIG. 3 (d)). Above the lower layer wiring circuit 13, a dielectric layer 14, formed of, for example, a photosensitive resin, is deposited (FIG. 3 (e)), and a via 15 is formed by etching (dry etching or wet etching) or pattern exposure and development, to expose the lower layer wiring circuit 13 (FIG. 3 (f)). Then, by means of a film forming technique, such as electroless plating, evaporation, or sputtering, an upper layer wiring circuit 16 is deposited. The wiring circuit is positioned to be electrically in contact with the via 15 and the lower layer wiring circuit 13 (FIG. (g)). By repeating the dielectric layer forming and etching process, and the circuit forming process, and the circuit layer forming processes, a multi-layer wiring board is formed on the organic substrate.

Published Unexamined Japanese Patent Application No. 51-118390 describes that after forming a polyimide film on the surface of an aluminum wired substrate, an organic Al compound layer is formed on the surface of the polyimide film, and a part of the Al compound layer on the polyimide film is removed to form a through hole. A second conductor layer is formed in the through hole to form a predetermined multi-wiring structure.

Published Unexamined Japanese Patent Application No. 58-93298 describes that after forming a circuitization layer on a substrate, a resist layer is formed thereon to form a lower-layer wiring pattern. Then, the resist layer is removed and a through hole is formed, an inter-layer insulation film constituting multi-layer wiring is made from a polyimide based resin, a resist film is formed on the insulation layer, a connecting through hole is formed, and after removing the resist film, an upper layer wiring is formed on the insulation layer which has been bake processed.

Published Unexamined Japanese Patent Application No. 60-180197 describes the formation of a first circuitization layer on a dielectric substrate and the deposition of a photopolymer film on the wiring pattern. The photopolymer film is photo-set by exposure and developed to form a photo-set film with a via hole formed in a predetermined position. Then, by use of the photo-set film as an inter-layer insulation film, a second layer wiring pattern is formed on the inter-layer dielectric film and via-hole. Further, the processes after the formation of the photo-polymer film are repeated in turn to form a multi-layer wiring pattern.

In Published Unexamined Japanese Patent Application No. 61-121393 and Published Unexamined Japanese Patent Application No. 61-127196, what is described is that using the insulation layer etching method, a wiring pattern of materials such as copper and chromium is formed on the sputtering method, or evaporation method, and at the same time, the via hole portions is made conductive to electrically connect to the conductor pattern of the lower layer.

The plating method process is shown in FIG. 5 (a) to (h). In this process, a metal film for lower layer wiring circuit 103 is deposited by a film forming method such as sputtering on a substrate 101. The substrate 101 has been coated with polyimide resin, and a lower layer wiring circuit 103 is formed in turn through photosensitive resist coating, pattern exposure, developing, resist removing, and etching (FIG. 5 (a)).

Further, photosensitive resist 104 is coated on the lower layer wiring circuit 103 (FIG. 5 (b)), and a resist hole 105 is formed through pattern exposure of the photosensitive resist 104, developing, and resist removal (FIG. 5 (c)). In this resist hole 105, a plating via 106 is formed, for example, by electroplating (FIG. 5 (d)), and the resist is removed by use of predetermined solvent (FIG. 5 (e)). Then, the polyimide 107 is applied thereon (FIG. 5 (f)), and the surface of the polyimide is abraded flat to expose the top of the plating pillar 106 (FIG. 5 (g)), and an upper layer wiring circuit 108 is formed by a film forming technique such as sputtering thereon (FIG. 5 (h)). Multi-layer wiring is formed by repetition of these processes. Published Unexamined Japanese Patent Application No. 61-90496 describes a process in which a metal foil for a conductive circuit is configured and forms a lower layer wiring. Then, a polyimide film is formed and a resist hole is formed by mechanical drilling or by laser ablation in the position desired to form vias. Then, a plated via is formed in the resist hole by locally providing plating solution and laser beam.

Published Unexamined Japanese Patent Application No. 63-43396 describes a process for forming multi-layer wiring in which a lower layer of wiring is formed on the whole surface of a multi-layer wiring alumina substrate, and after a positive type dry film is pressure bonded, a resist pattern is formed through exposure and developing. A plated via is formed in the via hole by electroplating. Then, after removal of the plating resist pattern by solvent, an insulation layer is applied, the surface of the insulation layer is ground to expose the peak of the plated via, another insulation layer is applied thereon, a resist hole of desired diameter is formed in the resist layer, copper is sputter coated in the resist hole and on the surface of the above insulation layer, and a circuit pattern is formed by etching to obtain the multi-layer wiring.

Published Unexamined Japanese Patent Application No. 63-244797 describes a process in which a positive type dry film is laminated on an alumina substrate which has a lower-layer wiring pattern formed thereon, to form a resist pattern, and a resist hole for a plated via is formed through exposure and development. Then, the resist hole is subjected to copper sulfate plating to form a plated via, the above resist is removed by use of acetone, and a polyimide insulation layer is applied. Then, the surface of the insulation layer is ground to expose the head of the pillar. Then, a copper layer is deposited on the surface of the insulation layer and the head of the plating pillar with sputtering apparatus to form a desired wiring pattern.

Published Unexamined Japanese Patent Application No. 61-179598 describes a process in which a wiring pattern of copper is formed as the lower layer of wiring on a ceramic substrate, and on the surface of these, a photoresist pattern is formed by use of ordinary photolithographic technique. Then, the portions of the lower wiring layer surface exposed through the photoresist hole are electroplated to coat the plated vias. The whole surface of the above plating pillar and the exposed substrate is coated with polyimide resin, and impressed with a specified pressure from the surface of the dielectric layer toward the substrate, to make the dielectric layer surface flat. Then, an upper wiring layer is evaporated in a pattern on the insulation layer surface to form wiring.

Published Unexamined Japanese Patent Application No. 62-263645 describes a process in which a chrome layer and a copper layer are applied in turn on a substrate, etched and a predetermined pattern is formed. A positive photoresist is applied on the copper layer, and an opening section (resist hole) is formed through exposure and development of the resist. Then, the positive photoresist is sililated. The sililated resist remains as it is as a solder barrier, and forms a solder via bump in the above mentioned opening by a method such as dipping in a molten solder bath, and the upper-layer wiring is connected to it.

Published Examined Patent Application No. 50-2059 describes that an insulating substrate such as ceramic is coated with a copper layer thereon as a lower-layer wiring, a photoresist film is bonded thereon, a resist hole is formed when this resist is exposed to light and developed, and a conductive material such as copper is deposited in the hole by electro-plating. After the end of the electroplating, the residual photoresist is removed and an insulating material such as epoxy resin is deposited instead of it, and on the conductive material and the insulating material, a copper layer is electroless plated in order to effect interlayer connection.

The alignment between the lower wiring circuit and the via must be accurate in order to electrically connect the lower layer wiring and the upper layer wiring. According to the prior art dielectric layer patterning methods, since there is pattern aligning error between the lower layer wiring circuit and the via, the via diameter must be enlarged by as much as the possible error, or, as shown in FIG. 4, the size of the lower-layer electric circuit 13 must be larger than the diameter of resist hole 15 or plated via 106, and, thus, the electric circuit wiring density cannot be increased.

The prior art plated via method has a drawback such that when forming a plated via in the resist hole by removing the photosensitive resist which was once applied to form a circuit pattern, an additional process of applying resist and removing it again must be carried out.

OBJECTS OF THE INVENTION

It is an object of the invention to make the inter layer connection between layers of a multi-layer substrate possible by forming an electric circuit of high wiring density, and preventing misalignment in position between the lower layer circuit and the plated via by utilizing one resist application for two pattern exposure/development processes.

Another object of the invention is to decrease the number of processes in the manufacture of a multi-layer wiring board, omitting the additional photosensitive resist removing and applying processes, by using the photoresist used in pillar formation in circuit pattern formation also.

SUMMARY OF THE INVENTION

These and other objects of the invention are achieved by the method for manufacturing a multilayer circuit board in which landless inter-layer connection is made between a lower-layer electric circuit and an upper-layer electric circuit formed on a substrate.

The method of the invention utilizes a single photoresist to form a circuitization layer and the conductive via extending upwardly from the circuitization layer. In the method of the invention a metal layer is applied to the substrate, and photoresist is applied to the metal layer. The photoresist is then exposed and developed to define a resist hole. A via bump is formed in the resist hole. The residual resist is then imaged to form a first circuit pattern in the underlying metal layer.

The remaining photoresist is removed from the first metal layer, and an organic dielectric layer is formed on the etched metal layer, the exposed substrate, and via bump. The organic dielectric layer is then flattened or otherwise processed to expose the surface of the via bump. Either a second metal layer or an electronic part is deposited or applied to the exposed top surface of the via bump as an upper-layer electric circuit element.

DETAILED DESCRIPTION OF THE INVENTION

Figure 1A:
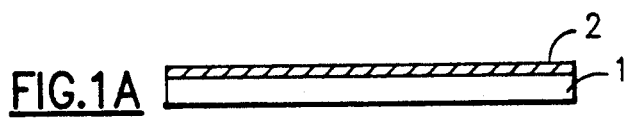
FIG. 1 (a) to (h) are process diagrams showing an embodiment of the invention.
Figure 1B:
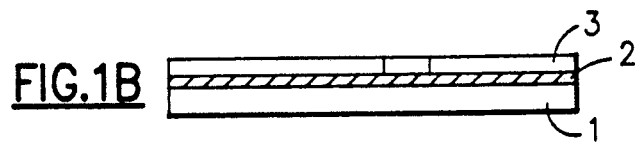
Figure 1C:
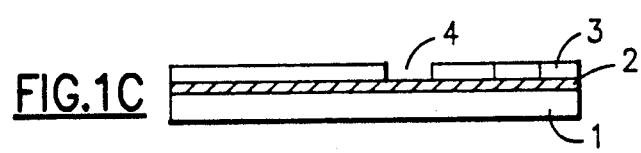
Figure 1D:
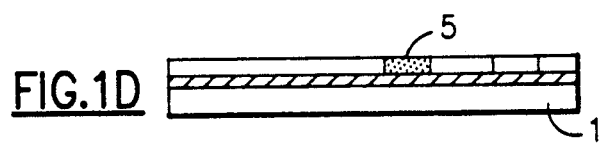
Figure 1E:
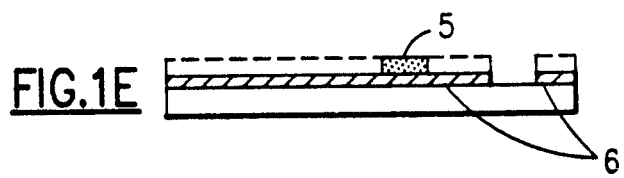
Figure 1F:
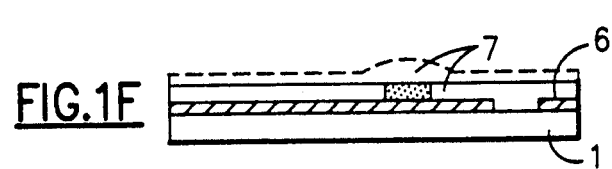
Figure 1G:
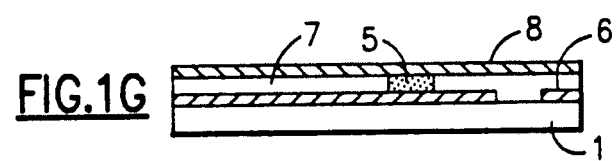
Figure 1H:
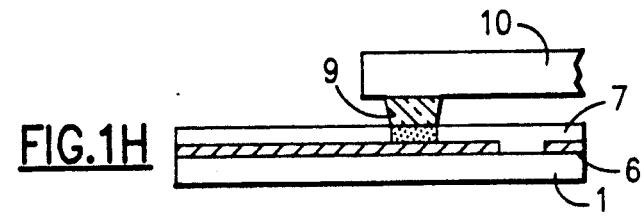

The present invention is a method of accurately forming landless interconnects between wiring planes and vias. The method comprises forming a conductive metal layer on a substrate, applying a positive photoresist to the conductive metal layer, and imaging portions of the photoresist, that is, selectively exposing, developing, and removing the positive resist to first form a hole or hole pattern in the resist. The hole pattern is used to form a via bump pattern therein. To define the lower-layer circuit pattern, the residual positive photoresist is exposed again, e.g., to cross link the resist. Then, a via bump is formed in the resist hole by electroplating. It is also possible to expose the residual positive photoresist again to define the lower-layer circuit pattern after via bump formation.

When the residual photoresist, that is, the photoresist remaining after exposure and development of the via hole pattern, is again developed and the resist that has been imaged into the lower layer circuit pattern is removed, the lower layer circuit pattern is defined. The metal layer is then partially exposed and etched. This defines the lower layer circuit pattern. When the surface of the substrate is partially uncovered, the lower-layer circuit is formed on the substrate. After the formation of the lower-layer electric circuit, the residual photoresist is removed with a suitable solvent. Then, the patterned metal layer, which has been etched, is coated with an organic dielectric layer, the surface of the organic dielectric layer is flattened to expose the surface of the via bump, and the exposed surface of the organic dielectric layer and the via bump is deposited with another metal layer or electronic part to form an upper electric circuit. This produces the multi-layer wiring board.

In this invention, due to the above construction, since the via bump constituting a connection to the lower coated metal layer is formed before the lower-layer electric circuitization is formed, there is no danger of a shift in position between the via bump and the lower-layer metallized electric circuit.

Furthermore, while the invention has been described with positive photoresist, it is possible to use negative photoresist. The positive photoresist is applied when forming the via bump, and when forming the lower-layer electric circuit as well.

An embodiment of the invention will be explained and illustrated with reference to FIG. 1 (a) to (h).

As shown in FIG. 1 (a), an organic substrate 1 is covered with a uniform, unpatterned metal layer 2 of 30 μm copper by a generally known film forming technique such as deposition, sputtering, or electroless plating. Then, a positive resist 3 is applied on the copper layer 2 (FIG. 1 (b)). Any photoresist generally available, such as AZ1350J (Shipley Co.), TNS (IBM Corp.), and PMER-P (Tokyooka Ltd.), can be used. It is usually applied by brushing, spin coating, or immersion.

Then, the positive photoresist 3 is exposed through a mask (not shown) (the via pattern section is opaque, and other sections are transparent) (FIG. 1 (b)), and developed. The resist area corresponding to the area where the via bump is formed is removed, and the resist hole 4 for the via bump is formed. This partially exposes the copper layer 3 where the lower-layer wiring assembly is to be formed (FIG. 1 (c)).

To define the lower layer circuit pattern, the residual positive photoresist 3 is again exposed through a mask (not shown) (the wiring pattern section is opaque, other sections are transparent) (FIG. 1 (c)). Alternately, to define the lower-layer circuit pattern after the via bump has been formed, the residual positive photoresist may be exposed again. Then, a via bump comprising copper, tin, or solder plating is formed in the resist hole 4 by electro-plating (FIG. 1 (d)).

In forming the via bump 5 with copper, atop a circuitization layer of copper, the via bump must be protected from the etchant used to pattern the circuitization. Thus, when etching the lower-layer wiring assembly comprised of copper as described later, to prevent the via bump from etching, the copper is covered with any one of the following: tin, solder plating, electrodeposited coat film, or electrodeposited positive photoresist film.

Figure 2:
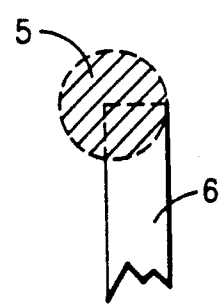
FIG. 2 is a schematic view showing the overlapping condition of the bump and the lower-layer circuit pattern relating to the invention.
Figure 4:
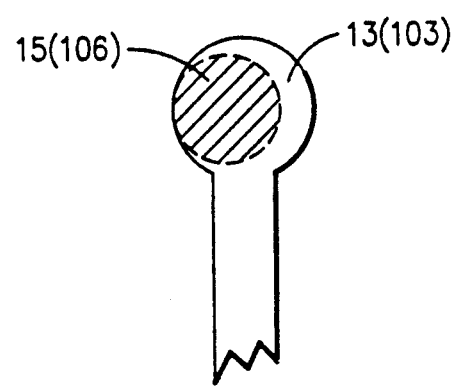
FIG. 4 is a schematic view showing the overlapping conditions of the conventional bump and the lower-layer circuit pattern.
Figure 3A:
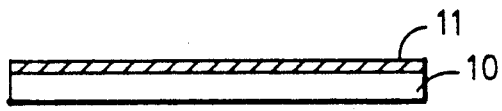
FIG. 3 (a) to (g) are process diagrams of the conventional insulation layer etching method.
Figure 3B:
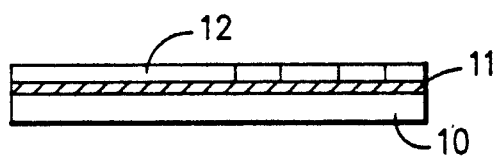
Figure 3C:
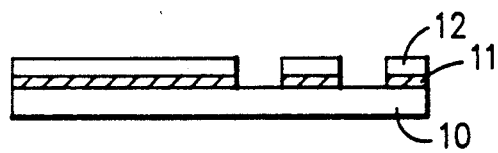
Figure 3D:
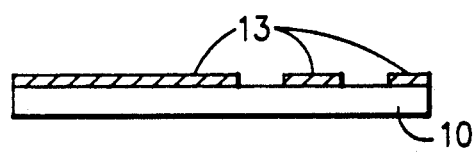
Figure 3E:
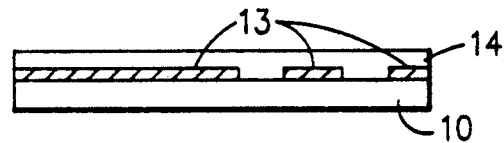
Figure 3F:
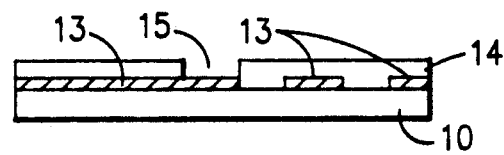
Figure 3G:
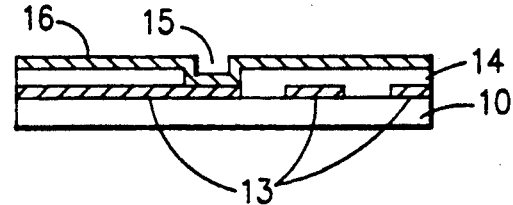
Figure 5A:
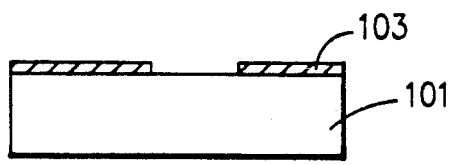
FIG. 5 (a) to (h) are process diagrams of the conventional plating pillar method.
Figure 5E:
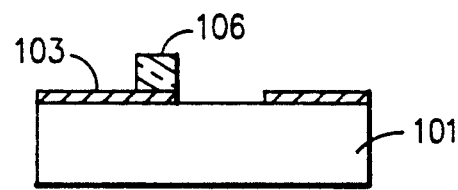
Figure 5B:
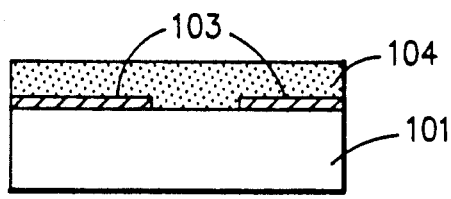
Figure 5F:
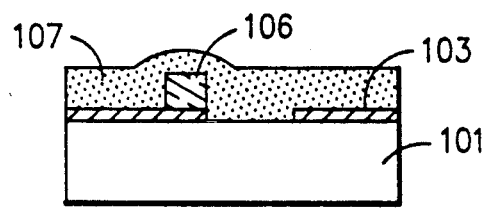
Figure 5C:
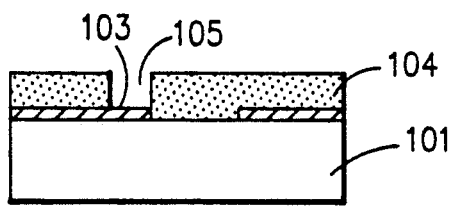
Figure 5G:
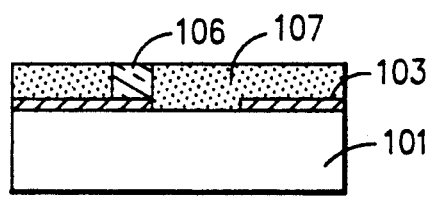
Figure 5D:
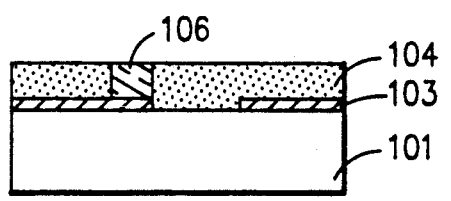
Figure 5H:
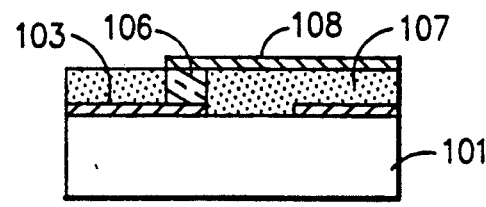

When the photoresist 3 is developed with alkaline developing solution such as NaOH and TMAM, the resist area exposed according to the lower-layer circuit pattern is removed. This partly exposes the copper layer 2 upon which the lower-layer wiring section is to be formed, and the copper layer 2 is etched with an etching solution. This etching may be a wet process of immersion in, for example, a mixed sulfuric acid and hydrogen peroxide etching solution at 50° C. for 2 min 30 sec. When the substrate is a ceramic, silicon, or glass, dry etching may be utilized in lieu of wet etching. Dry etching may be conducted using a known gas, such as Ar and CF$_4$, suitable to the material to be etched. While the surface of the substrate 1 is partly exposed, a lower-layer electric circuit 6 is formed on the substrate 1. Here, the via bump 5 and the lower-layer electric circuit 6 are exactly aligned in position with each other as shown in FIG. 2. After the lower-layer electric circuit 6 has been formed, the photoresist 3 is removed with adequate solvent.

FIG. 1 (f) shows an organic dielectric resin 7, such as epoxy resin, polyimide resin, or BT resin (bismaleimide-triazine resin), applied as a uniform, unpatterned layer, dried and set as a conformal layer so as to cover the surfaces of the organic substrate 1, via bump 5, and lower-layer electric circuit 6. Then, the surface of the organic dielectric resin 7 is polished with, for example, a belt sander (a rotary polishing machine with sand paper rolled in belt form) and a brush polishing machine (a polishing machine with a brush with abrasive grain applied to it) to expose the head of the via bump 5. a copper layer, is formed by a film making method such as electro-plating (FIG. 1 (g)). For a thin metal layer formed on a substrate such as of ceramic, silicone, or glass, a film can be formed by a film forming technique such as sputtering or evaporation. This electrically connects the lower-layer electric circuit 6 to the upper-layer electric circuit 8 through the via bump 5. Thus, multi-layer wiring can be formed by repeating this process. As shown in FIG. 1(h), instead of forming an upper-layer electric circuit metal layer, as the upper-layer electric circuit an electronic part 10 can be connected to the via bump 5 with solder 9. The via bump 5 can be formed with copper or with solder or tin on the copper, and its thickness can be changed as required. When the via bump 5 is formed with solder plating, the thickness of the via bump can be controlled as required, and an electronic part can be directly mounted on the via bump.

According to the invention, positional shift between the lower-layer electric circuit 6 and the via bump 5 is eliminated in the landless inter layer connection of a multi-layer board. This avoids the heretofore required increase in size of the circuit. As a result, an electric circuit of higher wiring density can be attained. In addition, by using the same layer of photoresist for more then one process, i.e., via bump 5 formation, and circuit 6 formation, the number of manufacturing processes can be decreased.

While the invention has been described with respect to certain preferred embodiments and exemplifications, it is not intended to limit the scope of the invention thereby, but solely by the claims appended hereto.

I claim:

1. A method for manufacturing a multilayer circuit board in which inter-layer connection is made between a lower-layer electric circuit and an upper-layer electric circuit formed on a substrate, comprising steps of:
(a) applying a metal layer on said substrate,
(b) applying a photoresist on said metal layer,
(c) exposing and developing said photoresist to define a resist hole,
(d) exposing the residual photoresist after said exposure and development to define a first circuit pattern,
(e) forming a via bump in said resist hole,
(f) developing said exposed residual photoresist,
(g) etching the metal layer exposed by the development of said residual photoresist to form a first circuit pattern in said metal layer,
(h) removing the remaining photoresist from the first metal layer,
(i) forming an organic dielectric layer on the etched metal layer, the substrate exposed by etching, and on the via bump,
(j) flattening the surface of said organic dielectric layer to expose the surface of said via bump, and
(k) depositing a second metal layer or an electronic part for forming an upper-layer electric circuit on the exposed surface of said organic dielectric layer and said via bump.

2. The method of claim (1) for manufacturing a multilayer circuit board, wherein said via bump consists of the same material as said first metal layer, and a protective film consisting of a material different from said material is formed on the upper portion of the plating via bump.

3. The method of claim (1) for manufacturing a multilayer circuit board, wherein said photoresist is a positive photoresist.

4. A method for manufacturing a multilayer circuit board, in which inter-layer connection is made between a lower-layer electric circuit and an upper-layer electric circuit formed on a substrate, comprising steps of:
(a) forming a metal layer on said substrate,
(b) coating a photoresist on said metal layer,
(c) exposing and developing said photoresist to define a resist hole,
(d) forming a via bump in said resist hole,
(e) exposing and developing the residual photoresist after said exposure and development to define a first electric circuit pattern,
(f) etching the metal layer exposed through the development of said photoresist to form said first electric circuit,
(g) removing the photoresist from the metal layer constituting the first electric circuit,
(h) coating an organic dielectric layer on the circuitized first metal layer etched, the substrate exposed by etching, and the via bump,
(i) flattening the surface of said organic dielectric layer to expose the surface of said via bump, and
(j) depositing another metal layer or electronic part on the exposed surface of said organic dielectric layer and said plating via bump.

5. The method of claim (4) for manufacturing a multilayer wiring board, wherein said via bump plating via bump consists of the same material as said metal layer, and a protective film consisting of a material different from said material is formed in the upper portion of the plating via bump.

6. The method of claim (4) for manufacturing a multilayer circuit board, wherein said photoresist is a positive photoresist.

* * * * *